United States Patent
Woelk et al.

(10) Patent No.: US 10,060,030 B2
(45) Date of Patent: Aug. 28, 2018

(54) EVAPORATION VESSEL APPARATUS AND METHOD

(71) Applicant: Ceres Technologies, Inc., Saugerties, NY (US)

(72) Inventors: Egbert Woelk, North Andover, MA (US); Ronald L. DiCarlo, Danville, NH (US)

(73) Assignee: Ceres Technologies, Inc., Saugerties, NY (US)

( * ) Notice: Subject to any disclaimer, the term of this patent is extended or adjusted under 35 U.S.C. 154(b) by 15 days.

(21) Appl. No.: 15/160,556

(22) Filed: May 20, 2016

(65) Prior Publication Data

US 2016/0265113 A1    Sep. 15, 2016

Related U.S. Application Data

(60) Continuation of application No. 13/959,699, filed on Aug. 5, 2013, which is a division of application No. 12/749,048, filed on Mar. 29, 2010, now Pat. No. 8,501,266.

(60) Provisional application No. 61/211,274, filed on Mar. 27, 2009.

(51) Int. Cl.
| | | |
|---|---|---|
| C23C 16/455 | (2006.01) | |
| C23C 14/24 | (2006.01) | |
| C23C 14/54 | (2006.01) | |
| C23C 16/448 | (2006.01) | |
| C30B 23/00 | (2006.01) | |
| C30B 25/14 | (2006.01) | |

(Continued)

(52) U.S. Cl.
CPC .......... *C23C 16/455* (2013.01); *C23C 14/243* (2013.01); *C23C 14/54* (2013.01); *C23C 16/4482* (2013.01); *C30B 23/00* (2013.01); *C30B 25/14* (2013.01); *C23C 14/0617* (2013.01); *C23C 14/0629* (2013.01); *C23C 16/301* (2013.01); *C23C 16/306* (2013.01)

(58) Field of Classification Search
CPC .......................... C23C 16/4482; C23C 16/455
See application file for complete search history.

(56) References Cited

U.S. PATENT DOCUMENTS

| | | | | |
|---|---|---|---|---|
| 3,939,858 A | | 2/1976 | LeMay | |
| 4,436,674 A | * | 3/1984 | McMenamin | ........... B01J 4/008 |
| | | | | 118/692 |

(Continued)

FOREIGN PATENT DOCUMENTS

| | | |
|---|---|---|
| EP | 0723214 A1 | 7/1996 |
| JP | 56120527 A | 9/1981 |

(Continued)

OTHER PUBLICATIONS

VaporStationTM Delivery System Brochure.

(Continued)

*Primary Examiner* — Karl Kurple
(74) *Attorney, Agent, or Firm* — Heslin Rothenberg Farley & Mesiti P.C.

(57) ABSTRACT

Disclosed is a method of providing a constant concentration of a metal-containing precursor compound in the vapor phase in a carrier gas. Such method is particularly useful in supplying a constant concentration of a gaseous metal-containing compound to a plurality of vapor deposition reactors.

4 Claims, 4 Drawing Sheets

(51) Int. Cl.
*C23C 16/30* (2006.01)
*C23C 14/06* (2006.01)

(56) References Cited

U.S. PATENT DOCUMENTS

| | | | |
|---|---|---|---|
| 4,517,220 A * | 5/1985 | Rose | C23C 16/4482 117/86 |
| 5,522,660 A | 6/1996 | O'Dougherty et al. | |
| 5,831,151 A | 11/1998 | Ondrus et al. | |
| 6,161,398 A * | 12/2000 | Partus | B01J 4/008 264/1.24 |
| 6,701,066 B2 | 3/2004 | Sandu | |
| 8,459,290 B2 | 6/2013 | Masakazu et al. | |
| 8,485,126 B2 | 7/2013 | Miyamoto et al. | |
| 8,821,637 B2 | 9/2014 | Gelatos | |
| 8,875,653 B2 | 11/2014 | Cobb et al. | |
| 2003/0095472 A1 | 5/2003 | Fukui | |
| 2003/0199649 A1 | 10/2003 | Orbison et al. | |
| 2004/0007180 A1 | 1/2004 | Yamasaki | |
| 2004/0035202 A1 | 2/2004 | Strauch et al. | |
| 2005/0095859 A1 | 5/2005 | Chen et al. | |
| 2006/0080041 A1 | 4/2006 | Anderson et al. | |
| 2007/0070803 A1 | 3/2007 | Urquhart | |
| 2007/0254093 A1 | 11/2007 | Nijhawan et al. | |
| 2009/0183676 A1 | 7/2009 | Fujii et al. | |
| 2010/0108153 A1 | 5/2010 | Minami et al. | |

FOREIGN PATENT DOCUMENTS

| | | |
|---|---|---|
| JP | 08022958 | 1/1996 |
| WO | 2001042539 A1 | 6/2001 |
| WO | 2002012780 A1 | 2/2002 |

OTHER PUBLICATIONS www.aixtron.com/index.php?id=707&L=1.
www.lorex.com/piezocon.html#pictures.
www.lorex.com/piezocon_app_epitaxy.html.
www.lorex.com/piezocon_app_mocvd.html.
European search reports corresponds with Europe Application No. 10 15 7463.
"What is a Mass Flow Controller" Horiba, Feb. 11, 2016, www.horiba.com/horiba-stec/products/mass-flow-technology/what-is-a-mass-flow-controller, pp. 1-2.

* cited by examiner

EVAPORATION VESSEL APPARATUS AND METHOD

METHOD AND APPARATUS

This Application is a Continuation of application Ser. No. 13/959,699, filed on Aug. 5, 2013, which is a Divisional of application Ser. No. 12/749,048, filed on Mar. 29, 2010, now U.S. Pat. No. 8,501,266, which claims the benefit of priority of Provisional Application Ser. No. 61/211,274, filed on Mar. 27, 2009.

The present invention relates generally to a method, and apparatus for, delivering precursors in the vapor phase to epitaxial reactors. In particular, the present invention relates to a method, and apparatus, for maintaining concentration of a precursor in the vapor phase relative to a carrier gas.

Chemical vapor deposition ("CVD") processes are used in the electronics industry, particularly the semiconductor industry, to deposit layers of material. Precursors, which may be solid or liquid, are typically provided in cylinders. In use, a carrier gas enters the cylinder, passes through the precursor, becomes saturated with the precursor, and then the carrier gas/precursor vapor mixture exits the cylinder and is directed to a deposition reaction chamber. In the deposition chamber, a layer or film of the precursor is grown on a substrate.

Typically, cylinders (also referred to as bubblers or more generally as evaporation vessels) are made of stainless steel and have a gas inlet extending into and below the surface of the precursor. This gas inlet is commonly referred to as a "dip-tube". High purity carrier gas passes through the dip tube, bubbles up through the liquid precursor, and transports the precursor vapor to the deposition reactor.

For most CVD processes it is essential to dispense exactly metered amounts of precursor vapor (usually measured in mmol/min or some other convenient unit) to the reaction chamber. The common method to deliver precise amounts of precursor vapor relies on tight control of the temperature of the precursor and the total pressure in the evaporation vessel (cylinder). FIG. 1 illustrates a conventional high-performance precursor vaporization apparatus for CVD processes having a carrier gas feed line 1, a mass flow controller 2 in the carrier gas feed line, precursor cylinder 3 contained within a temperature regulating chamber 4, precursor cylinder 3 containing precursor 6, and having a dip-tube 5 for directing the carrier gas into precursor cylinder 3 below the level of precursor 6, gas exit line 7 for directing carrier gas/precursor vapor mixture away from precursor cylinder 3 and to reaction chamber 9, gas exit line 7 containing optional concentration transducer 8 which transmits a signal to electronic controller 10 which in turn adjusts mass flow controller 2 (according to the equation $\dot{m}=\dot{m}_0+A(c-c_0)$ with calibration constant A). The mass flow controller 2 is composed of a mass flow transducer and a gas flow valve. The precursor temperature is controlled by maintaining the cylinder in a temperature regulated chamber. Evaporating liquid precursor in the cylinder will slightly lower the temperature of the liquid and will accordingly lower the concentration of the precursor in the vapor phase relative to the carrier gas. For most CVD systems which use small-sized cylinders to supply precursor compound to a single reaction chamber, such slight temperature drop does not appreciably affect the concentration of the precursor in the vapor phase. Any change in concentration can be adjusted for by increasing the mass flow of the carrier gas into the bubbler but for the majority of installations the changes are so miniscule that concentration transducer 8 is omitted. This approach provides a constancy of precursor concentration in the vapor phase that is better than ±0.5% of a set value (e.g., for a precursor concentration set value of 10 mol %, the vapor phase concentration ranges from 9.95% to 10.05%), which is acceptable for the large majority of CVD processes.

There is a trend in the industry to move to larger-sized cylinders, which reduces equipment down time because cylinders are changed less often. Such larger-sized cylinders are also increasingly used to supply a precursor to one or more deposition reactors. Also, specialized CVD processes require a more active control of the vapor concentration to compensate for uneven evaporation of precursor (due to evaporative cooling of the precursor liquid in the cylinder). When a cylinder supplies precursor to multiple reactors, compensating for reduced vaporized precursor concentration relative to the carrier gas by increasing the flow of the gas mixture does not solve the problem of reduced precursor concentration. For example, each reactor might be running a different deposition process and may have different concentration requirements. Also, the information for proper adjustment of the mass flow may not be available unless a concentration transducer is used.

Apparatuses for delivering vaporized precursor to a plurality of deposition reactors using a single precursor source cylinder are known. For example, International Patent Application WO 2001/42539 (Ravetz et al.) discloses a method and apparatus for delivering vaporized precursor to a plurality of epitaxial reactors which utilizes conventional mass flow controllers to adjust the flow rate to each epitaxial reactor. This approach of Ravetz is conventional in that it relies on adjustment of the mass flow and does not have any means to compensate for vapor phase precursor concentration changes. This approach fails to provide vaporized precursor concentration control required by advanced vapor deposition methodologies The present invention, which addresses the deficiencies of conventional processes, provides a method of depositing a film on a substrate, including: (a) providing an evaporation vessel including a chamber containing a precursor compound to be vaporized, the evaporation vessel having a gas inlet and a gas outlet, a carrier gas feed line in fluid communication with the gas inlet, a gas control valve, and a gas exit line in fluid communication between the gas outlet and one or more vapor deposition reactors, the gas exit line having a pressure transducer and a concentration transducer, each of the gas control valve, pressure transducer, and concentration transducer in electrical connection with a controller; (b) conveying a gaseous mixture including vaporized precursor compound and a carrier gas to the one or more vapor deposition reactors; (c) maintaining a substantially constant concentration of the precursor compound in the gaseous mixture by the steps selected from the group consisting of: (1) sensing a concentration of the vaporized precursor compound in the gaseous mixture in the gas exit line; comparing the sensed concentration (c) with a reference concentration ($c_0$) to provide a concentration differential ($c-c_0$); generating a signal in the controller utilizing the concentration differential; transmitting the signal to the gas control valve wherein the signal adjusts the gas control valve to adjust the total pressure within the evaporation vessel in order to maintain a substantially constant concentration of the vaporized precursor compound in the gaseous mixture in the gas exit line; (2) providing the evaporation vessel with a temperature sensing means, the temperature sensing means situated so as to sense temperature of precursor compound; sensing the temperature of the precursor compound; comparing the sensed temperature (T) with a reference temperature ($T_0$) to provide a temperature differential ($T-T_0$); generating a signal in the controller utilizing the temperature differential; transmitting the signal to the gas control valve wherein the signal adjusts the gas control valve to adjust the total pressure within the evaporation vessel in order to maintain a substantially constant concentration of the vaporized precursor compound in the gaseous mixture in the gas exit line; and (3) a combination of (1) and (2); and (d) subjecting the gaseous mixture to conditions in the one or more deposition reactors sufficient to deposit a film.

The present invention further provides a system for delivering a substantially constant concentration of a vaporized precursor compound in a carrier gas including an evaporation vessel including a chamber containing a precursor compound to be vaporized, the evaporation vessel having a gas inlet and a gas outlet, a carrier gas feed line in fluid communication with the gas inlet, and a gas exit line in fluid communication between the gas outlet and one or more vapor deposition reactors; a gas control means; a sensing means in the gas exit line for sensing a concentration of the vaporized precursor compound in the gaseous mixture in the gas exit line; means for comparing the sensed concentration (c) with a reference concentration ($c_0$) to provide a concentration differential ($c-c_0$); signal generating means for generating a signal in a concentration controller utilizing the concentration differential; and a means for transmitting the signal to the gas control valve wherein the signal adjusts the gas control valve to adjust total pressure in the evaporation vessel in order to maintain a substantially constant concentration of the vaporized precursor compound in the gaseous mixture in the gas exit line.

The present invention also provides a system for delivering a substantially constant concentration of a vaporized precursor compound in a carrier gas including an evaporation vessel including a chamber containing a precursor compound to be vaporized, the evaporation vessel having a gas inlet and a gas outlet, a carrier gas feed line in fluid communication with the gas inlet, a gas exit line in fluid communication between the gas outlet and one or more vapor deposition reactors, and a temperature sensing means situated within the evaporation vessel so as to sense temperature of precursor compound; means for comparing the sensed temperature (T) with a reference temperature ($T_0$) to provide a temperature differential ($T-T_0$); a gas control means; means for generating a signal in a controller utilizing the temperature differential, and a means for transmitting the signal to the gas control valve wherein the signal adjusts the gas control valve to adjust total pressure in the evaporation vessel in order to maintain a substantially constant concentration of the vaporized precursor compound in the gaseous mixture in the gas exit line.

In the figures, like reference numerals refer to like elements.

Figure 1:
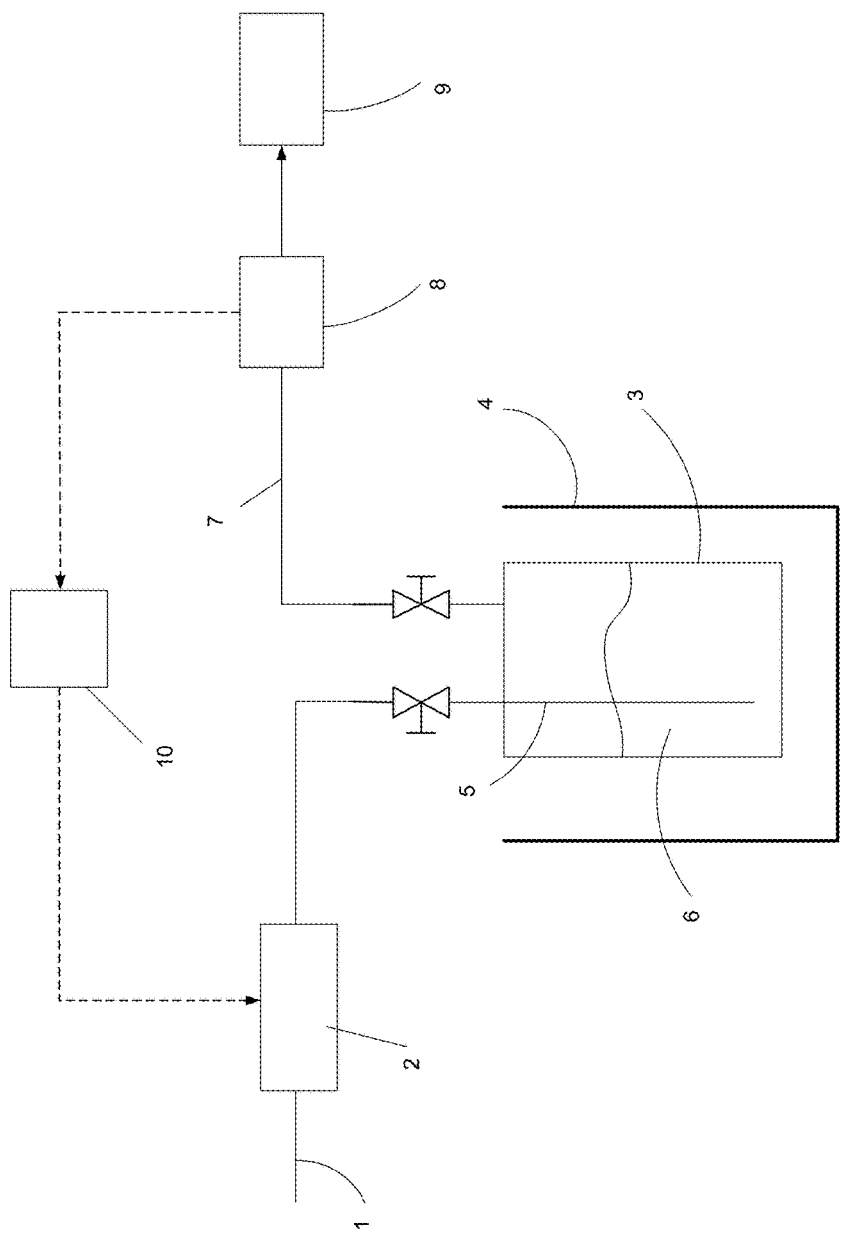
FIG. 1 illustrates a conventional precursor vaporization apparatus for CVD processes.

The present invention provides a method of providing a gaseous mixture of a precursor compound and carrier gas to one or more vapor deposition chambers (or reactors), and preferably to a plurality of reactors, wherein the gaseous mixture has a substantially constant concentration of vaporized precursor compound. By "substantially constant concentration" is meant a vapor phase concentration of ±1% of a reference concentration, preferably ±0.5% of the reference concentration, more preferably ±0.3%, and yet more preferably ±0.25% (for example, for a precursor concentration set value of 10 mol %, the vapor phase concentration preferably ranges from 9.975% to 10.025% mol %). Any suitable carrier gas, which may be reactive or non-reactive, may be used in the present invention. The particular choice of carrier gas depends upon a variety of factors, including the precursor compound used and the particular chemical vapor deposition system employed. Examples of carrier gases include, without limitation, hydrogen, helium, nitrogen, argon and mixtures thereof. Hydrogen and nitrogen are preferred.

As used herein, the term "precursor compound" refers to any compound used to provide a film-forming element in the vapor phase to a vapor deposition reactor, particularly a reactor for chemical vapor deposition. Exemplary film-forming elements include, without limitation, metals, metalloids, and carbon. Precursor compounds useful in the present invention may be either liquids or solids under the vaporization conditions employed. For example, solid precursor compounds having a low melting point may be kept in the liquid state by heating the cylinder. Preferably, the precursor compound is a liquid under the evaporation conditions. Suitable precursor compounds include metalorganic compounds. As used herein, the term "metalorganic compounds" also includes metalloid-organic compounds, that is organic compounds containing a metalloid element such as silicon, germanium, phosphorus, bismuth, and antimony. Exemplary precursor compounds include, without limitation, trimethylgallium, triethylgallium, trimethylaluminum, trimethylindium, dimethylzinc, silane, dichlorosilane, boron trichloride, isobutyl germane, and germanium tetrachloride.

In typical operation, the precursor compound is placed in an evaporation vessel and the evaporation vessel is then placed in a vapor delivery apparatus. Evaporation vessels may be constructed of any suitable material, such as glass, polytetrafluoroethylene or metal, as long as the material is inert to the precursor compound contained therein. Metals are preferred, particularly nickel alloys and stainless steels. Suitable stainless steels include, but are not limited to, 304, 304 L, 316, 316 L, 321, 347 and 430. Suitable nickel alloys include, but are not limited to, INCONEL, MONEL, and HASTELLOY. It will be appreciated by those skilled in the art that a mixture of materials may be used in the manufacture of such evaporation vessels.

A carrier gas enters the evaporation vessel through a gas inlet opening, which may be at the top or the bottom of the evaporation vessel. In the case of a liquid precursor, the carrier gas typically passes through a dip-tube extending into and below the surface of the precursor. As the carrier gas exits the dip-tube, it bubbles up through the precursor compound and becomes saturated with precursor compound vapor. The carrier gas/precursor compound vapor mixture exits the evaporation vessel through a gas outlet and is conveyed to a deposition reactor. Exemplary evaporation vessels having a dip-tube include those disclosed in U.S. Pat. Nos. 4,506,815 and 5,755,885.

In the case of a solid precursor, the evaporation vessel may contain one or more chambers and a porous element. The solid precursor is typically disposed on the porous element, the porous element typically being the floor or a part of the floor of a chamber containing the precursor compound. The carrier gas may pass up through the porous element and then through the solid precursor compound. Alternatively, the carrier gas may pass first through the precursor compound and then through the porous plate. As the carrier gas passes through the precursor compound it picks-up vaporized precursor to form a gas stream including vaporized precursor admixed with carrier gas. The amount of vaporized precursor picked-up by the carrier gas may be controlled. It is preferred that the carrier gas is saturated with vaporized precursor. The carrier gas exits the chamber containing the precursor compound and optionally enters an outlet chamber which is in fluid contact with the inlet chamber before exiting the evaporation vessel through an outlet opening. Exemplary evaporation vessels for solid precursor compounds include those disclosed in U.S. Pat. Nos. 4,704,988 (Mellet); 5,603,169 (Kim); and 6,607,785 (Timmons et al.).

The carrier gas may be used at a wide variety of flow rates. Such flow rates are a function of the evaporation vessel cross-sectional dimension, pressure and system demands. Larger cross-sectional dimensions allow higher carrier gas flows, i.e. linear velocity, at a given pressure. The carrier gas flow entering the evaporation vessel, exiting the evaporation vessel or both entering and exiting the vessel may be regulated by a control means. Any suitable control means may be used, such as manually activated control valves or computer activated control valves.

In use, the evaporation vessel may be used at a variety of temperatures. The exact temperature will depend upon the particular precursor compound used and desired application. The temperature controls the vapor pressure of the precursor compound, which controls the flux of the material needed for specific growth rates or alloy compositions. Such temperature selection is well within the ability of one skilled in the art. For example, when the precursor compound is trimethyl indium, the temperature of the evaporation vessel may be from 10° to 60° C. Other suitable temperature ranges include from 35° to 55°, and from 35° to 50° C. The evaporation vessel may be heated by a variety of heating means, such as by placing the vessel in a thermostatic bath, by direct immersion of the vessel in a heated oil bath or by the use of a halocarbon oil flowing through a metal tube, such as a copper tube, surrounding the vessel.

After exiting the evaporation vessel, the precursor compound vapor/carrier gas mixture is conveyed to a deposition chamber (reactor). The deposition chamber is typically a heated vessel within which is disposed at least one, and possibly many, substrates. The deposition chamber has an outlet, which is typically connected to a vacuum pump in order to draw by-products out of the chamber and to provide a reduced pressure where that is appropriate. Chemical vapor deposition can be conducted at atmospheric or reduced pressure. The deposition chamber is maintained at a temperature sufficiently high to induce decomposition of the precursor compound. The deposition chamber temperature is typically from 200° to 1200° C., the exact temperature selected being optimized to provide efficient deposition. Optionally, the temperature in the deposition chamber as a whole can be reduced if the substrate is maintained at an elevated temperature, or if other energy such as radio frequency ("RF") energy is generated by an RF source. Suitable substrates for deposition, in the case of electronic device manufacture, include, but are not limited to, silicon, germanium, gallium arsenide, indium phosphide, and sapphire. Such substrates are particularly useful in the manufacture of various electronic and photovoltaic devices.

As used herein, the term "transducer" refers to the sensor that converts a physical quantity into an electrical signal. Preferred concentration transducers are acoustic concentration sensors that directly measure the concentration of a binary gas mixture, that is vaporized precursor compound in a carrier gas. "Controller" refers to the circuitry or software that utilizes the input of a transducer in combination with a reference value to adjust an actuator (or valve) in a prescribed way. A transducer and a controller may be provided as individual units or as an integrated unit. Integrated transducer and controller units are generally commercially available, such as the EPISON™ 4 concentration monitor available from Aixtron AG (Aachen, Germany) or the PIEZOCON™ controller from Lorex Industries, Inc. (Poughkeepsie, N.Y.).

Figure 2:
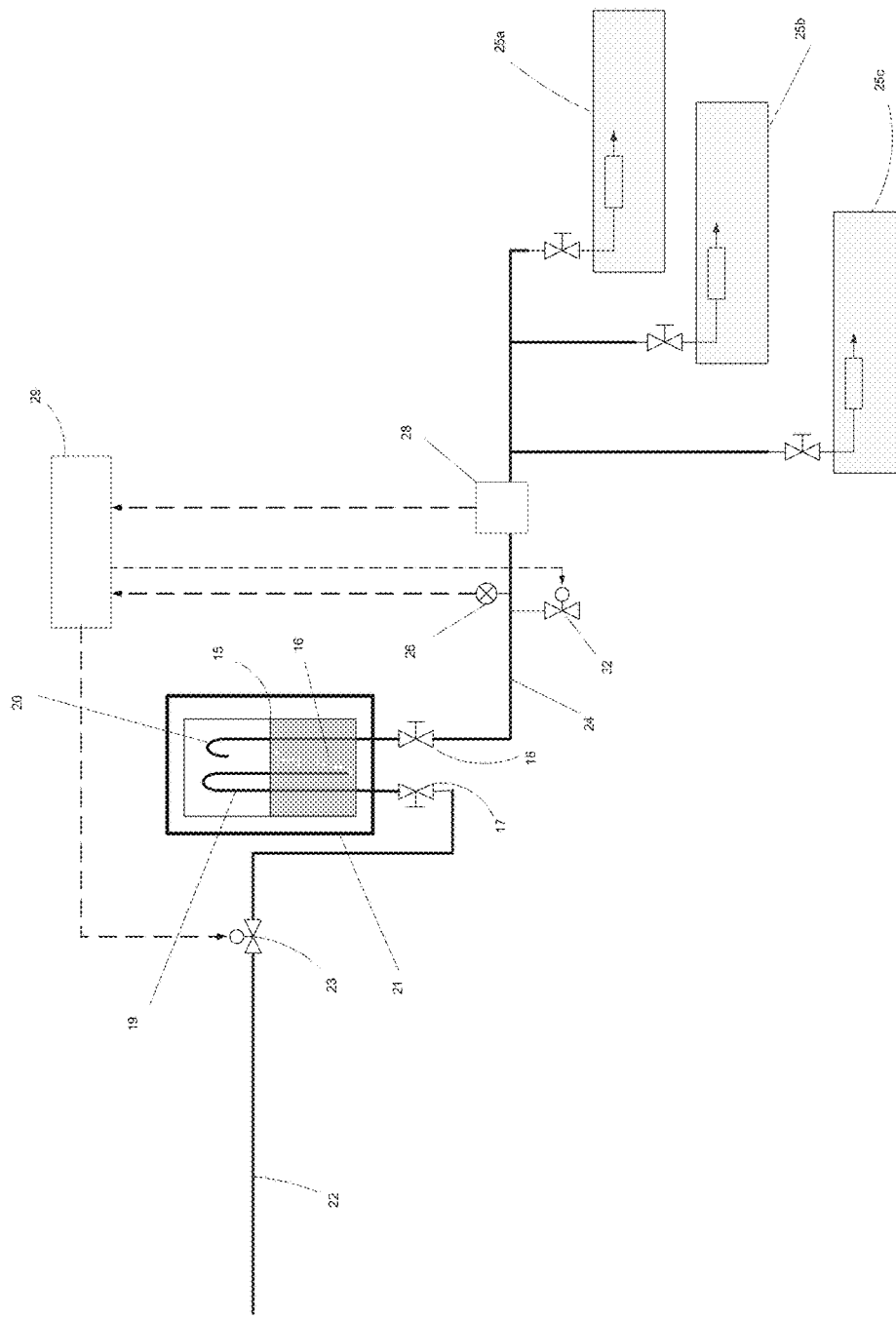
FIG. 2 illustrates an apparatus of the invention having a concentration sensing means.

From a cost and infrastructure standpoint, it is desirable to use one central vapor delivery system for multiple reactors and one concentration transducer and one controller for the entire installation. FIG. 2 illustrates such an apparatus for delivering a precursor compound vapor-carrier gas mixture having evaporation vessel 15 containing liquid precursor compound 16, such as trimethylgallium, and having carrier gas inlet 17, gas outlet 18, dip-tube 19 and gas exit tube 20, evaporation vessel 15 contained within temperature regulating chamber 21. Carrier gas is provided to the evaporation vessel through feed line 22, having gas control means (valve) 23, which is connected to carrier gas inlet 17 and is in electrical connection with controller 29. In use, the carrier gas passes through control valve 23, enters evaporation vessel 15 through carrier gas inlet 17 and exits dip-tube 19 and bubbles up through precursor compound 16 to form a gas stream of a mixture of precursor compound vapor and carrier gas. This gas stream then exits the evaporation vessel through exit tube 20, passes through gas outlet 18 and through gas exit line 24 toward a plurality of reaction chambers illustrated as 25a, 25b, and 25c, although less than 3 or more than 3 reaction chambers may be present. Gas exit line 24 has pressure transducer 26, concentration transducer 28 and pressure release valve 32, each of these in electrical connection with controller 29. When excess pressure builds in the system, a signal is transmitted from controller 29 to pressure release valve 32 which then adjusts the total pressure by releasing (or venting) a portion of the gas stream.

Dip-tube 19 is shown extending upwards from the bottom of evaporation vessel 15, extending above the surface of precursor compound 16, forming a u-bend and then extending downward below the surface of precursor compound 16. It will be appreciated by those skilled in the art that various dip-tube configurations are possible, such as extending downward from the top of the evaporation vessel toward the bottom of the vessel or extending inward from a side of the evaporation vessel and bending downward toward the bottom of the vessel. In operation, the gas exit end of the dip-tube must be below the surface of the precursor compound.

Concentration transducer 28 is typically an acoustic concentration sensor which senses the concentration of the precursor compound vapor in the gas stream, generates a signal and sends this signal to controller 29. The controller then compares the sensed concentration (c) with a reference concentration ($c_0$) to provide a concentration differential ($c-c_0$), generates a signal utilizing this concentration differential, and transmits the signal to gas control valve 23 wherein the signal adjusts gas control valve 23 to adjust the total pressure within evaporation vessel 15 in order to maintain a substantially constant concentration of the vaporized precursor compound in the gaseous mixture in gas exit line 24. The precursor compound vapor reference concentration is programmed into controller 29. Such reference concentration will vary depending upon the particular precursor compound used, the type and number of deposition reactor employed, and the particular film being deposited in the deposition reactor. The particular reference concentration input is well within the ability of one skilled in the art.

When concentration transducer 28 senses a change in concentration, the controller 29 adjusts the total pressure accordingly by acting on gas control means (valve) 23 and restores the vaporized precursor compound concentration in the gas stream to the reference concentration value. A suitable equation for adjusting the pressure using the "integral" capability of a commercial PID (proportional integral differential) controller is:

$$p = p_o + B \int_{time} (c - c_o)$$

where in $P_0$ is the reference pressure, $c_0$ is the reference concentration and B is a calibration constant. Each of $p_0$, and $c_0$ are programmed into controller 29. The reference concentration $c_0$ is the desired concentration of vaporized precursor compound in the gas stream. In order to maintain a substantially constant vaporized precursor compound concentration in the gas stream, sensed concentration c is maintained such that it is substantially equal to the reference concentration $c_0$.

Unlike the conventional approach of acting on the carrier gas mass flow into the evaporation vessel, controller 29 acts on the total pressure of the system in order to correct for precursor compound concentration fluctuations in the gas exit line. This method leads to small pressure fluctuations in the central delivery system. These small pressure fluctuations introduced by the control system will not have an adverse effect on the performance of the mass flow controllers in the reactors. While the total pressure in the gas exit line is adjusted, it is important that the total pressure remain sufficiently high for a mass flow controller inside the CVD system to work properly.

Figure 3:
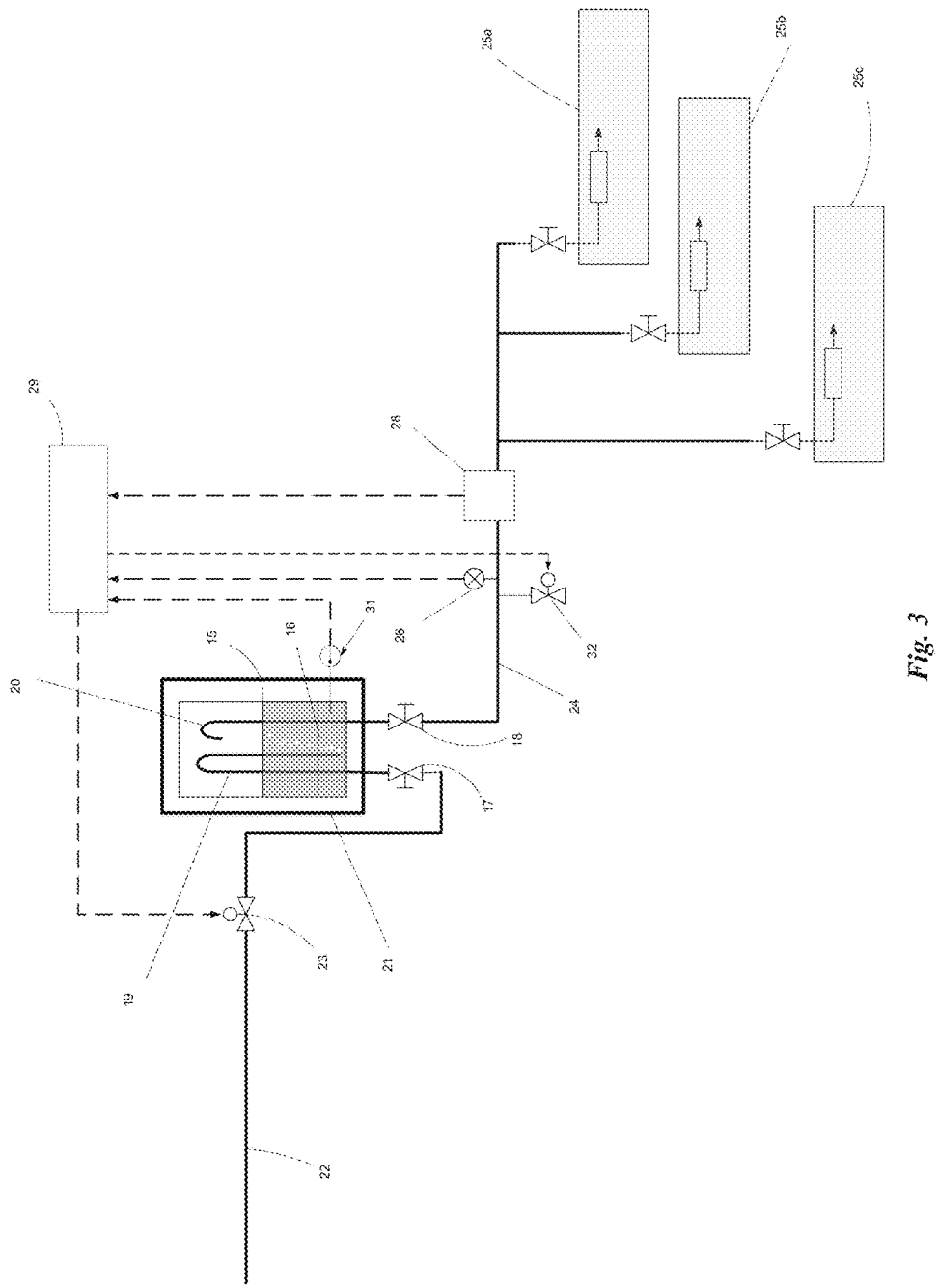
FIG. 3 illustrates an apparatus of the invention having a temperature sensing means.

Concentration transducers can be quite expensive so an alternate apparatus for maintaining a substantially constant concentration of precursor compound vapor in the gas stream is also contemplated by the present invention. FIG. 3 illustrates an alternate apparatus for delivering a precursor compound vapor-carrier gas mixture having evaporation vessel 15 containing liquid precursor compound 16, such as trimethylaluminum, and having carrier gas inlet 17, gas outlet 18, dip-tube 19, gas exit tube 20 and temperature sensor 31, evaporation vessel 15 contained within temperature regulating chamber 21. Carrier gas is provided to the evaporation vessel through feed line 22, having gas control valve 23, which is connected to carrier gas inlet 17 and in electrical connection with controller 29. In use, the carrier gas passes through control valve 23, enters evaporation vessel 15 through carrier gas inlet 17 and exits dip-tube 19 and bubbles up through precursor compound 16 to form a gas stream of a mixture of precursor compound vapor and carrier gas. This gas stream then exits the evaporation vessel through exit tube 20, passes through gas outlet 18 and through gas exit line 24 toward a plurality of reaction chambers illustrated as 25a, 25b, and 25c, although less than 3 or more than 3 reaction chambers may be present. Gas exit line 24 has pressure transducer 26, concentration transducer 28 and pressure release valve 32, each of these in electrical connection with controller 29.

Temperature sensing means (or sensor) 31 is located within evaporation vessel 15 so as to sense temperature of the precursor compound. Temperature sensing means 31 may be any suitable sensor, such as a thermocouple. The temperature sensing means may be constructed out of any suitable material that is non-reactive with the precursor compound.

Concentration transducer 28 is typically an acoustic concentration sensor which senses the concentration of the precursor compound vapor in the gas stream, generates a signal and sends this signal to controller 29. Temperature sensing means 31 senses a temperature of the precursor compound in evaporation vessel 15, generates a signal and sends this signal to controller 29. The controller then compares the sensed temperature (T) with a reference temperature ($T_0$) to provide a temperature differential ($T-T_0$), generates a signal utilizing this temperature differential, and transmits a signal to gas control valve 23 wherein the signal adjusts gas control valve 23 to adjust the total pressure within evaporation vessel 15 in order to maintain a substantially constant concentration of the vaporized precursor compound in the gaseous mixture in gas exit line 24.

In this embodiment, the total pressure is adjusted using the actual, measured temperature of the evaporating liquid precursor compound. The change of the vapor pressure with temperature is well known. Using the temperature measurement, the total pressure is changed by the same fraction as the vapor pressure and as a result the concentration will remain constant. Reference temperature $T_0$ and reference pressure $P_0$ are inputted into controller 29. These inputs are used to determine the desired precursor compound concentration in the gas stream. If the precursor compound evaporation rate changes (either detected via concentration transducer 28 or temperature sensor 31), the total pressure is adjusted in order to compensate. The change of the total pressure is relatively fast, such as requiring only a few seconds. Using a reference temperature as an input, a suitable control equation for the pressure controller using the "proportional" capability of a commercially available PID controller is $p=p_0+D(T-T_0)$ where $p_0$ is the reference pressure, p is the pressure, D is a calibration constant, T is the sensed temperature and $T_0$ is a reference temperature. Normally, the temperature dependence of the vapor pressure is linearized for the reference temperature. With the use of a digital controller the temperature dependence of the vapor pressure can be programmed and used for any reference temperature and no recalibration is required.

Figure 4:
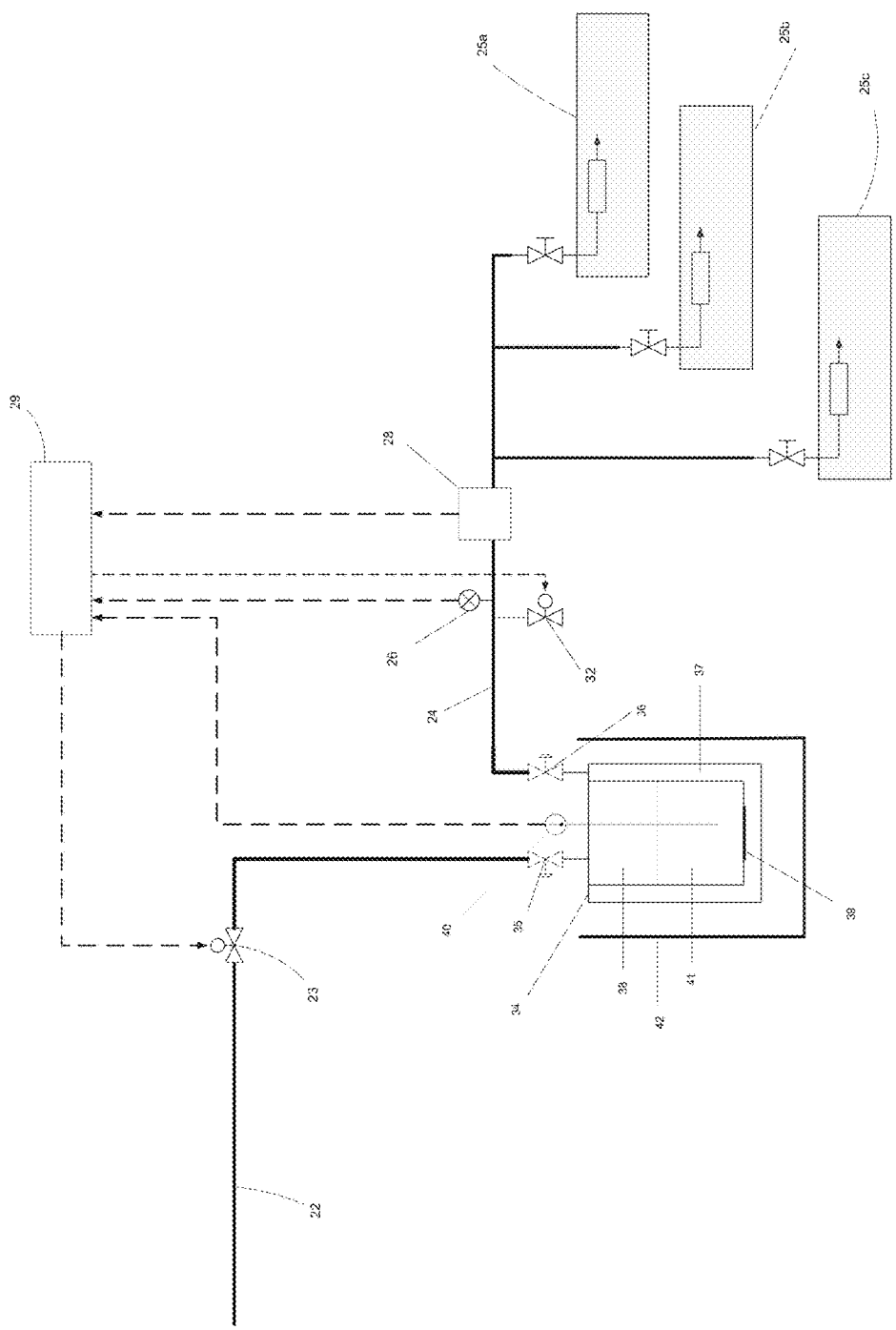
FIG. 4 illustrates an apparatus of the invention suitable for solid precursor compounds.

FIG. 4 illustrates an apparatus for delivering a precursor compound vapor-carrier gas mixture having evaporation vessel 34 having carrier gas inlet 35 and gas outlet 36, evaporation vessel 34 having inlet chamber 38 having a floor containing porous element 39 in fluid communication with outlet chamber 37, and solid precursor compound 41, such as trimethylindium, contained within inlet chamber 38. Evaporation vessel 34 is contained within temperature regulating chamber 42. FIG. 4 shows evaporation vessel 34 containing optional temperature sensing means 40, which is in electrical connection with controller 29. Any of the temperature sensing means discussed above are suitable for use with a solid precursor compound.

Porous element 39 is typically a frit having a controlled porosity. Porous elements having a wide variety of porosities may be used. The particular porosity will depend upon the a variety of factors well within the ability of one skilled in the art. Typically, the porous element has a pore size of from about 1 to about 100 microns, preferably from about 1 to about 10 microns. However, porous elements having porosities greater than 100 microns may be suitable for certain applications. Any material may be used to construct the frit provided it is inert to the organometallic compound used and the desired porosity can be controlled. Suitable materials include, but are not limited to, glass, polytetrafluoroethylene or metals such as stainless steels or nickel alloys. It is preferred that the porous element is sintered metal, and more preferably stainless steel. The suitable stainless steels and nickel alloys suitable for preparing the porous element are those described above for the manufacture of the cylinder.

Carrier gas is provided to the evaporation vessel through feed line 22, having gas control means (valve) 23, which is connected to carrier gas inlet 35 and is in electrical connection with controller 29. In use, the carrier gas passes through control valve 23, enters evaporation vessel 34 through carrier gas inlet 35 and enters inlet chamber 38. The carrier gas then percolates through solid precursor compound 41 and entrains or picks-up precursor compound vapor forming a gas stream of a mixture of vaporized precursor compound and carrier gas. The gas stream then passes through porous element 39, enters outlet chamber 37 and exits the evaporation vessel through outlet 36. Next, the gas stream is conveyed through gas exit line 24 toward a plurality of reaction chambers illustrated as 25a, 25b, and 25c, although less than 3 or more than 3 reaction chambers may be present. Gas exit line 24 has pressure transducer 26, concentration transducer 28 and pressure release valve 32, each of these in electrical connection with controller 29. When excess pressure builds in the system, a signal is transmitted from controller 29 to pressure release valve 32 which then adjusts the total pressure by releasing (or venting) a portion of the gas stream.

Controller 23 may be either an analog or programmable digital proportional integral differential controller. Digital controllers are preferred given their economy, flexibility and availability.

Any suitable gas control means may be used in the present invention. Typically, the gas control means 23 is a control valve. In FIGS. 2 and 3, gas control means 23 is shown in gas feed line 22. Alternatively, the gas control means may be present in gas exit line 24. As a further alternative, two gas control means may be used, one in the gas feed line and one in the gas exit line. Preferably, the gas control means is in the gas feed line. When two gas control means are used, one such means is static (that is, set to a particular value) and the other gas control means is used to adjust the total pressure in order to maintain a substantially constant concentration of vaporized precursor compound in the gas mixture, and preferably the control means in the gas exit line is static.

Alternatively, a substantially constant concentration of precursor compound concentration in the gas stream can be maintained by a combination of the above methods, namely sensing precursor compound temperature and comparing the sensed temperature with a reference temperature to provide a temperature differential, and sensing precursor compound concentration and comparing the sensed concentration with a reference concentration to provide a concentration differential, generating a signal in a controller using the temperature differential and the concentration differential, and transmitting the signal to the gas control valve wherein the signal adjusts the gas control valve to adjust total pressure within the evaporation vessel in order to maintain a substantially constant concentration of the precursor compound vapor in the gaseous mixture in the gas exit line.

It will be appreciated by those skilled in the art that the apparatus in either FIG. 2 or FIG. 3 may optionally contain a precursor compound fill-port. Such a fill-port allows for periodic addition of additional precursor compound, such as from a separate precursor compound reservoir. In this way, the evaporation vessel may remain in continuous use with less system downtime which would be the result when an empty evaporation vessel is replaced with a full one. Such fill-ports are typically used in evaporation vessels used to deliver liquid precursor compound in the vapor phase.

One advantage of the method and apparatus described herein is that a substantially constant concentration of vaporized precursor compound in the gas stream is maintained rather than maintaining a constant mass flow of carrier gas into the evaporation vessel. Control of the precursor compound concentration is more direct and eliminates the need to change the mass flow. There is no need in the present apparatus for a mass flow transducer in the gas feed line, and preferably there is no such mass flow transducer in the gas feed line. A further advantage of the present invention is that precursor compound vapor generation and vaporized precursor compound concentration control can be contained within the vapor delivery apparatus. This is extremely desirable as control is centralized in the vapor delivery apparatus rather than being spread out over the central delivery system and several the several CVD reactors.

What is claimed is:

1. An apparatus for delivering a substantially constant concentration of a vaporized precursor compound in a carrier gas to a plurality of vapor deposition reactors, comprising: an evaporation vessel comprising a chamber containing a precursor compound to be vaporized, the evaporation vessel having a gas inlet and a gas outlet, a carrier gas feed line in fluid communication with the gas inlet, a gas exit line in fluid communication between the gas outlet and the plurality of vapor deposition reactors, and a temperature sensing means situated within the evaporation vessel so as to sense temperature of the vaporized precursor compound; means for comparing the sensed temperature (T) with a reference temperature (To) to provide a temperature differential (T-To) of the vaporized precursor compound; wherein the means for comparing comprises a controller; a gas control means in the carrier gas feed line; wherein the gas control means comprises a gas control valve and the gas control valve is electrically connected to the controller; means for generating a signal in the controller utilizing the temperature differential; a means for transmitting the signal to the gas control means wherein the signal adjusts the gas control means to adjust a total pressure in the evaporation vessel in order to maintain the substantially constant concentration of the vaporized precursor compound in a gaseous mixture in the gas exit line; and with no mass flow transducer in the carrier gas feed line, wherein the gas exit line further comprises a pressure transducer and a concentration transducer; wherein the concentration transducer in the gas exit line senses a concentration of the vaporized precursor compound in the gaseous mixture in the gas exit line; wherein the pressure transducer and the concentration transducer are electrically connected to the controller and said controller is configured to maintain the substantially constant concentration of the vaporized precursor compound in the gaseous mixture in the gas exit line with steps selected from the group consisting of :

1) sensing a concentration of the vaporized precursor compound in the gaseous mixture with the concentration transducer in the gas exit line, comparing the sensed concentration with a reference concentration to provide a concentration differential, generating a signal in the controller utilizing the concentration differential, transmitting the signal to the gas control valve wherein the signal is configured to adjust the gas control valve to adjust the total pressure within the evaporation vessel in order to maintain a substantially constant concentration of the vaporized precursor compound in the gaseous mixture in the gas exit line;

2) sensing the temperature of the vaporized precursor compound within the evaporation vessel with the sensing means, comparing the sensed temperature with a reference temperature to provide a temperature differential, generating a signal in the controller utilizing the temperature differential, transmitting the signal to the gas control valve wherein the signal adjusts the gas control valve to adjust the total pressure within the evaporation vessel in order to maintain a substantially constant concentration of the vaporized precursor compound in the gaseous mixture in the gas exit line; and (3) a combination of (1) and (2).

2. The apparatus of claim 1 wherein a second gas control valve is present in the gas exit line.

3. The apparatus of claim 1 wherein the gas exit line further comprises a pressure release valve.

4. The apparatus of claim 1, wherein the temperature sensing means comprises a temperature sensor, wherein the means for generating a signal comprises the controller, and wherein the means for transmitting the signal comprises the controller.

* * * * *